United States Patent
Kuznetsov et al.

(10) Patent No.: US 7,427,329 B2
(45) Date of Patent: Sep. 23, 2008

(54) TEMPERATURE CONTROL FOR SINGLE SUBSTRATE SEMICONDUCTOR PROCESSING REACTOR

(75) Inventors: Vladimir Kuznetsov, Ultrecht (NL); Ernst H. A. Granneman, Hilversum (NL)

(73) Assignee: ASM International N.V., Bilthoven (NL)

(*) Notice: Subject to any disclaimer, the term of this patent is extended or adjusted under 35 U.S.C. 154(b) by 211 days.

(21) Appl. No.: 10/410,699

(22) Filed: Apr. 8, 2003

(65) Prior Publication Data
US 2003/0209200 A1 Nov. 13, 2003

Related U.S. Application Data

(63) Continuation-in-part of application No. 10/141,517, filed on May 8, 2002, now Pat. No. 6,843,201.

(51) Int. Cl.
*H01L 21/00* (2006.01)
*C23C 16/00* (2006.01)
*C23C 14/00* (2006.01)

(52) U.S. Cl. .............. 118/725; 118/724; 118/728; 219/444.1; 219/544; 219/638; 219/648; 219/656; 219/702; 156/345.52; 156/345.53

(58) Field of Classification Search ............ 118/724, 118/725; 156/345.52, 345.53; 219/444.1, 219/544, 638, 648, 656, 702
See application file for complete search history.

(56) References Cited

U.S. PATENT DOCUMENTS

| | | |
|---|---|---|
| 3,836,751 A | 9/1974 | Anderson |
| 3,947,236 A | 3/1976 | Lasch, Jr. |
| 4,738,748 A | 4/1988 | Kisa |
| 4,860,687 A | 8/1989 | Frijlink ............... 118/500 |
| 4,975,561 A | 12/1990 | Robinson et al. |
| 5,294,778 A | 3/1994 | Carman et al. |
| 5,332,442 A | 7/1994 | Kubodera et al. |

(Continued)

FOREIGN PATENT DOCUMENTS

JP 63-136532 8/1988

(Continued)

OTHER PUBLICATIONS

Porter et al., "Fast-ramp rapid vertical processor for 300-mm Si wafer processing," *Part of the SPIE Conference on Process, Equipment, and Materials Control in Integrated Circuit Manufacturing IV*, Santa Clara, CA, Sep. 1998, SPIE vol. 3507.

*Primary Examiner*—Ram N. Kackar
(74) *Attorney, Agent, or Firm*—Knobbe Martens Olson & Bear LLP

(57) ABSTRACT

A reactor for heat treatment of a substrate having a process chamber within a substrate enclosing structure, and a support structure configured to position a substrate at a predetermined spacing between the upper part and the bottom part within the process chamber during processing. Streams of gas may lift the substrate from the support structure so that the substrate floats. A plurality of heating elements is associated with at least one of the upper part and the bottom part and are arranged to define heating zones. A controller controls the heating elements individually so that each heating zone is configured to have a predetermined temperature determined by the controller. The heating zones provide for a non-uniform heating laterally across the substrate.

30 Claims, 11 Drawing Sheets

U.S. PATENT DOCUMENTS

| | | | |
|---|---|---|---|
| 5,430,271 A | 7/1995 | Orgami et al. | |
| 5,650,082 A | 7/1997 | Anderson | |
| 5,790,750 A | 8/1998 | Anderson | |
| 5,891,251 A | 4/1999 | MacLeish | |
| 5,997,588 A | 12/1999 | Goodwin et al. | |
| 6,001,175 A | 12/1999 | Maruyama et al. | |
| 6,064,799 A | 5/2000 | Anderson et al. | |
| 6,072,162 A * | 6/2000 | Ito et al. | 219/444.1 |
| 6,080,969 A | 6/2000 | Goto et al. | |
| 6,099,056 A | 8/2000 | Siniaguine et al. | |
| 6,111,225 A | 8/2000 | Ohkase et al. | |
| 6,179,924 B1 * | 1/2001 | Zhao et al. | 118/725 |
| 6,183,565 B1 | 2/2001 | Granneman et al. | |
| 6,207,936 B1 | 3/2001 | De Waard et al. | |
| 6,222,990 B1 * | 4/2001 | Guardado et al. | 392/416 |
| 6,329,304 B1 | 12/2001 | Kuznetsov et al. | |
| 6,492,621 B2 * | 12/2002 | Ratliff et al. | 219/390 |
| 6,644,965 B2 | 11/2003 | Ookura et al. | |
| 6,901,317 B2 * | 5/2005 | Starner | 700/299 |

FOREIGN PATENT DOCUMENTS

| | | |
|---|---|---|
| JP | 08236533 | 9/1996 |
| JP | 10321505 | 12/1998 |
| JP | 11008204 A * | 1/1999 |
| WO | WO 00/42638 | 7/2000 |
| WO | WO/00/68977 | 7/2000 |
| WO | WO 00/68977 | 11/2000 |
| WO | WO 01/69656 A2 | 9/2001 |

* cited by examiner

TEMPERATURE CONTROL FOR SINGLE SUBSTRATE SEMICONDUCTOR PROCESSING REACTOR

REFERENCE TO RELATED APPLICATION

This application is a continuation-in-part of U.S. application Ser. No. 10/141,517, filed May 8, 2002 now U.S. Pat. No. 6,843,201.

FIELD OF THE INVENTION

The invention relates generally to reactors for treating wafers. More particularly, the invention relates to reactors that process wafers individually and a method of operating such a reactor.

BACKGROUND AND SUMMARY OF THE INVENTION

One type of reactor processes wafers in batches where the wafers of a batch are simultaneously subject to the same treatment. Another type of reactor processes wafers individually. The latter type of reactor is typically used to process larger wafers, i.e., wafers that have a diameter of about 200 millimeters or 300 millimeters. A floating wafer reactor, as described in U.S. Pat. No. 6,183,565, for example, processes a single wafer at a time. Current state-of-the-art technology is configured for 300-millimeter wafers; future technology is expected to employ even larger substrates.

The reactor described in the '565 patent is a "hot wall" reactor having an upper part and a bottom part that form a process chamber and that include heating elements to heat the process chamber and the wafer to a predetermined temperature. The upper and bottom parts are relatively massive, such that a stable temperature is reached for the entire chamber, relatively unaffected by the loading of cold wafers. A controller controls the heating elements so that the actual temperature of the reactor is the same as a predetermined temperature selected for a particular process step. Within the process chamber, the wafer is supported upon gas cushions ("floating") at a very short distance from upper and lower walls of the process chamber by gas flows in opposing direction from the upper and lower walls.

While the wafer is in the process chamber, the wafer is subject to a variety of processing options. In one option, the wafer is subjected to one or more stages of heat treatment such as annealing, during which the wafer is exposed to an inert gas ($N_2$, Ar, He) only. In another option, during treatment the wafer is exposed at least part of the time to a reactant gas such as an oxidizing gas ($O_2$ or $H_2O$, $N_2O$, $CO_2$) or a nitridizing gas ($NH_3$, $N_2$, depending on the temperature). In yet another option, the treatment can include chemical vapor deposition (CVD).

The environment in which the reactor is placed, for example, a clean room of a laboratory or a semiconductor fabrication plant, is usually at room temperature. That is, at the beginning of the wafer processing or at the beginning of one of the processing stages, a handling apparatus moves the upper and lower parts apart to open the reactor and loads the wafer horizontally into the process chamber. By moving the upper and lower parts towards each other such that the wafer is at a very short distance from the upper wall and the lower wall, the wafer is heated very quickly and is then exposed to a very high temperature, for example, 1000° C. during annealing, compared to the room temperature.

U.S. Pat. No. 6,329,304 and Dutch application No. 1018086, both assigned to applicant, describe methods and apparatuses to achieve a reproducible treatment for a series of substrates. U.S. Pat. No. 6,329,304 describes that when a wafer is loaded into the process chamber of a floating wafer reactor, the surface temperature of the walls facing the wafer drops by about 10° C., whereas the interior temperature of the walls, i.e., further away from the wall surfaces, drops by about 3° C. Although the reactor's temperature control can compensate for this unequal wall temperature, a resultant time delay is undesirable for certain processes. Therefore, U.S. Pat. No. 6,329,304 discloses applying a pulse of energy to the heating elements during loading the wafer in order to heat the walls for a short period of time independently from the temperature sensors. The additional heating during that time is intended to compensate for the temperature drop.

In Dutch application No. 1018086 a more sophisticated method is described. According to the method described, a substrate is loaded when a desired starting temperature is measured in the reactor wall, close to the wall surface facing the wafer. The heat transfer to the wafer results in a drop in measured temperature, followed by a recovery. The substrate to be treated is removed from the reactor before the starting temperature is reached again whereas the next substrate is loaded at the moment the starting temperature is reached again. In particular for very short process times, this methods helps to achieve a reproducible thermal budget for each one of a series of substrates to be treated sequentially.

Reactors configured to perform a thermal treatment are typically provided with a plurality of heating zones. The purpose of these multiple heating zones is to achieve a uniform temperature inside the reactor so that a substrate receives a uniform treatment over its entire surface. Parts of the reactor that are located in the periphery of the reactor suffer from a larger heat loss than parts of the reactor that are more centrally located. Consequently, more power needs to be supplied to heating zones that are located near the periphery to compensate for this heat loss and to achieve the desired uniform temperature.

A problem encountered during operation of the floating wafer reactor as described above is that for short anneals, with an anneal time of the same order of magnitude as the unloading time of the substrate, a non-uniform process result over each wafer was achieved whereas the temperatures were within the control limits and uniform over the wafer. Interestingly, the process result, in this case the resistivity of the substrate, showed a distinct unidirectional trend in a direction parallel to the direction of unloading of the wafer from the reactor. In other cases, the resistivity over the wafer showed a radial gradient. When increasing the anneal time, these gradients disappear but then other substrate properties are affected in an unacceptable way. In certain embodiments or applications, the very short anneal times are mandatory. It is contemplated that temperature gradients during removal of the substrate from the reactor influence the process result in a significant and undesirable way.

It is an object of the present invention to provide a method and apparatus for processing a substrate that allows very short processing times whereas the disadvantage of a non-uniform process result is avoided.

In accordance with one aspect of the invention, a reactor is provided for heat treatment of a flat substrate. The reactor includes a heated body, having a substantially flat surface facing a flat substrate during processing. A substrate handling mechanism is configured to place the flat substrate to be processed parallel to and in close proximity to the substantially flat surface of the heated body, and configured to remove said substrate in a removal direction from the heated body after processing. A plurality of heating elements are associated with the heated body and arranged to define heating zones connected to a controller. The controller is configured to control the heating elements, while the controller and heating zones are configured to provide for a non-uniform temperature laterally across the flat surface of the heated body.

In accordance with another aspect of the invention, a method of operating a thermal reactor is provided for the treatment of flat substrates. The method includes loading a substrate into the reactor. Heating elements are selectively operated to define a non-uniform temperature distribution across a heated body adjacent the substrate, which distribution extends in a lateral direction over the substrate and is selected to compensate for an uneven thermal effect upon the substrate during operation of the reactor. The substrate is processed for a predetermined period of time while the substrate is subject to the non-uniform temperature distribution. The substrate is unloaded from the reactor after the predetermined period of time.

In accordance with a further aspect of the invention, a reactor for heat treatment of a flat substrate is provided. The reactor includes a substrate enclosing structure defining a process chamber between an upper part and a bottom part. The upper and bottom parts are configured to separate for loading and unloading a flat substrate along a loading/unloading direction. A support structure is configured to position the substrate between the upper part and the bottom part. The substrate has major surfaces within about 2 mm of each of the tipper part and the bottom part within the process chamber during processing. A plurality of heating elements is arranged to define heating zones, each extending over only a portion of upper and bottom parts. A controller is connected to the heating elements individually, the controller being programmed to provide a non-uniform temperature distribution across at least one of the upper and lower parts.

BRIEF DESCRIPTION OF THE DRAWINGS

These and other aspects, advantages and novel features of the invention will become apparent upon reading the following detailed description and upon reference to the accompanying drawings. In the drawings, same elements have the same reference numerals.

DETAILED DESCRIPTION OF THE PREFERRED EMBODIMENTS

In the method according to the invention a substrate is subjected to a heat treatment. During the heat treatment, the substrate is placed in close proximity to a heated body, wherein a steady state temperature gradient is established over the heated body during the heat treatment. A method for processing substrates, wherein the substrates are intentionally subjected to a non-uniform temperature is described by Porter et al., "*Fast-Ramp Rapid Vertical Processor For* 300-*nm Si Wafer Processing,*" *SPIE*, Vol. 3507, September 1998, pages 42-53. Porter et al. describe that during heating of a vertically spaced stack of wafers in a vertical batch furnace the edges of the wafers run hotter than the wafer centers while during cooling of the load the center to edge difference is reversed with the wafer centers hotter than the wafer edges by a few degrees. Therefore, Porter et al. disclose that the heating apparatus can be arranged to repeatedly heat-up and cool-down the wafers for short periods of 5-10 minutes and admit process gas in the furnace only during the cool-down stages whereas during the heat-up stage an inert gas is admitted in the furnace. This results in an improvement of the deposited film thickness over the surface of each wafer for processes that are normally inflicted with a relatively thick deposition on the wafer edge. In this case, however, the temperature gradient over the wafer occurs in a dynamic situation only and is not very precisely controlled.

Figure 1A:
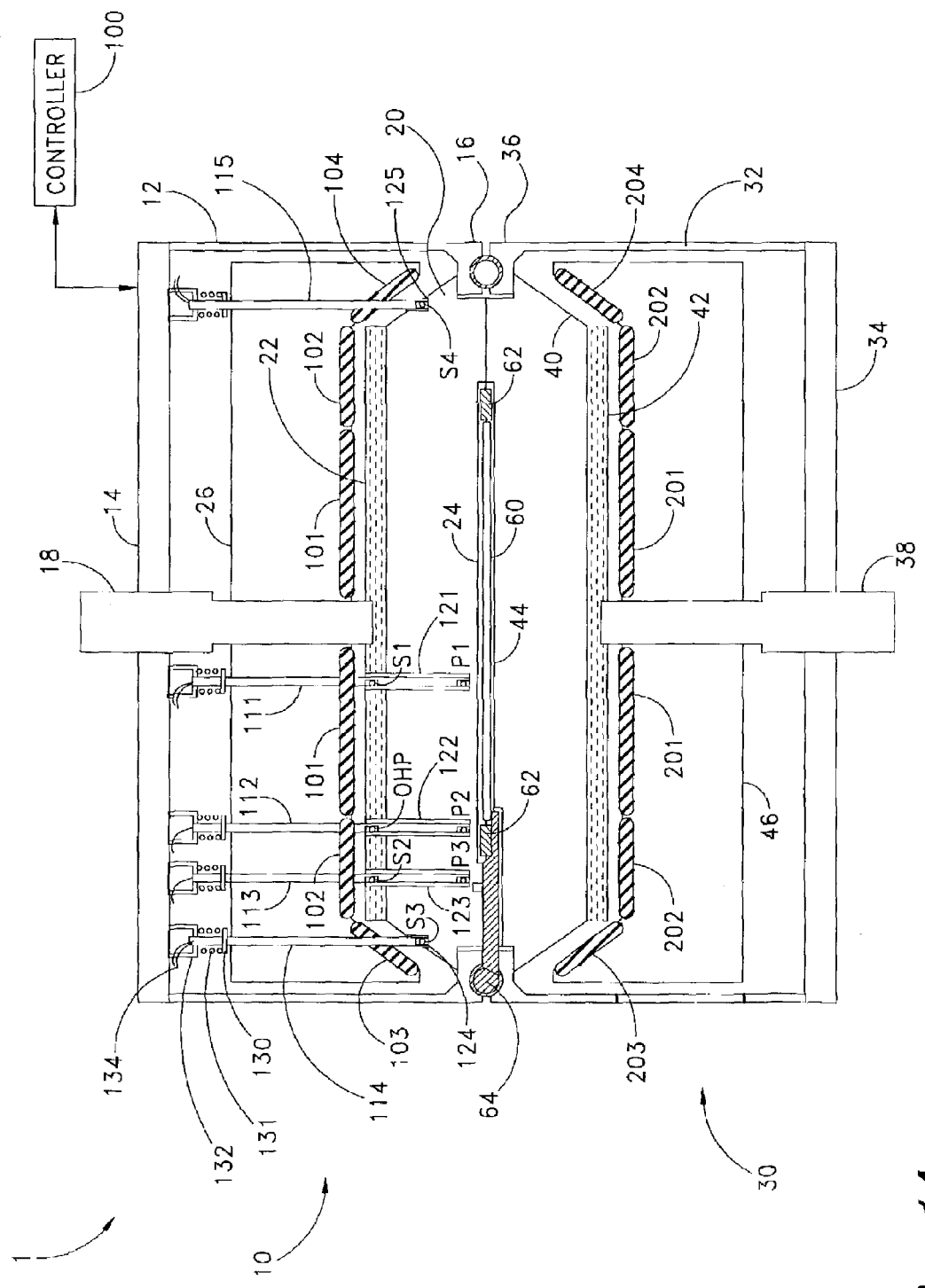
FIG. 1A shows a schematic cross section of a reactor that includes a wafer positioned in a chamber formed by an upper part and a bottom part, wherein heating elements are arranged to define several heating zones in accordance with one embodiment of the present invention.

FIG. 1A illustrates a reactor 1 in accordance with one embodiment of the invention. The reactor 1 is a single-substrate reactor in which a substrate is positioned horizontally between and closely spaced (for example, less than about one millimeter) from two high-mass blocks that act as a thermal flywheel and which are preferably maintained at a constant temperature. The substrate may be positioned through streams of gas that pass through passages in the blocks and exit the blocks on both sides of the substrate in vertical direction and pass along the horizontal surfaces of the substrate. The gas, therefore, causes the substrate to float. In another embodiment, spacers may support and hold the substrate horizontally, closely spaced from the high-mass blocks during processing.

The substrate is preferably heated through conduction rather than radiation. In one embodiment, the reactor 1 is configured for rapid thermal process applications, for example, a rapid thermal anneal process. During the rapid thermal annealing, the substrate is subject to rapid heating to an elevated temperature, for example, about 1000° C. Such annealing may serve, for example, to crystallize material, diffuse dopants, activate dopants, re-orient grains, reorder the crystal structure, etc., in a manner that affects material or device properties (for example, resistivity) or removes stresses. By positioning a substrate at a small distance from a high thermal mass block, heat transfer through conduction will be very high and the substrate rapidly assumes the temperature of the block, without a large effect on the temperature of the block. After the thermal annealing, the substrate is removed to a cool-down station.

However, temperature effects may occur at the beginning and the end of the substrate processing during loading of a substrate into the reactor or removal of a substrate from the reactor. FIG. 1A shows the reactor 1 in a closed, process position. To load a substrate, the blocks are moved apart and a substrate handling mechanism transports a substrate into the space delimited by the blocks. The leading edge of the substrate will be first inserted in the gap between the blocks and will receive heat radiation from the blocks. The trailing edge will be the last part of the substrate inserted in the gap between the blocks and will receive the heat radiation late. This results in an uneven heat-up of the substrate and an uneven thermal budget over the substrate. However, this is usually not very critical. For example, if the block temperature is 1000° C., the heat transfer between the blocks and the substrate during lateral transport of the substrate, when the blocks are in an open position is small compared to when the blocks are in the closed position. Premature heating of part of the substrate to a temperature of a few hundred degrees is not so relevant.

During unloading, however, a different situation occurs. At the moment that the blocks are moved apart, the wafer is 1000° C. During removal, the leading edge is the first part moved from between the blocks and is able to loose heat by radiative transport. The initial trajectory of the cool-down curve, for example, from 1000° C. to 900° C. occurs in a short time. It is exactly this high temperature region that appears to be critical for the thermal budget and the final process result. Consequently, it is particularly the inhomogeneous cooling during removal of the substrate from the reactor that results in a variation of the thermal budget over the surface of the substrate, in the direction of transport of the substrate. As an example, it has been found that a substrate, after annealing for a short period of time, may have a substantially linear profile in sheet resistivity with the direction of the resistivity gradient parallel to the direction of removal of the substrate. Further, it has been found that a circular substrate may have a radial profile in sheet resistivity after a short annealing process. Apparently, upon moving the reactor blocks away from each other after processing, the substrate edge looses more heat by radiation than the center of the substrate, resulting in a lower edge temperature. The substrate's sheet resistivity is, therefore, non-uniform and a function of the location on the wafer. Other material properties may be similarly non-uniformly affected.

The principles and advantages of the methods and structures described herein are particularly applicable to annealing for short periods of time. To describe this in more detail, we define the anneal time as the time during which the wafer is in close proximity with the heated body. In the illustrated embodiment, during the wafer removal time the wafer is not in close proximity with the heated body anymore, but at least part of the wafer is still facing the heated body. This removal time is shorter than the total unloading or transfer time required to transfer a wafer from the reactor to a subsequent station. The present invention is particularly relevant when a ratio of anneal time to removal time is smaller than 10:1, and more preferably smaller than 3:1.

The reactor 1 in accordance with the preferred embodiment of the invention reduces the effects that negatively affect the substrate's sheet resistivity or other such thermally influenced properties. The reactor 1 is configured with individually controllable heating elements that define heating zones, each having a predetermined temperature determined by a controller. The heating zones are geometrically configured such that a temperature gradient in a direction parallel to the direction of wafer loading or removal can be induced. A temperature controller is preferably configured to provide for asymmetrical heating of the zones to compensate for uneven temperature distribution during unloading.

Referring to FIG. 1A, the reactor 1 is shown in a closed position with a substrate, particularly a wafer 60, positioned in a process chamber 61. The wafer 60 may have a diameter of 300 millimeters or 200 millimeters and is subject to one or more stages of chemical treatment, such as CVD, one or more stages of heat treatment such as annealing, or a combination of chemical and heat treatment stages. Hereinafter, the description focuses mainly on annealing processes and reactors configured therefor and, thus, describes the reactor 1 for an annealing process. However, it is contemplated that the principles and advantages described herein also apply to reactors that can provide for chemical treatment and have equipment that provide for such chemical treatment. Such equipment supplies gas to the wafer and exhausts the gas from the reactor.

The reactor 1 has an upper part 10 and a bottom part 30. The upper part 10 has a sidewall 12, a top wall 14, a flange 16 at the sidewall 12 and a bearing shaft 18. The upper part 10 further includes a block 20, a block cover plate 22 and a recess 24 that defines part of the process chamber 61. An insulation material 26 surrounds the block 20 between the top wall 14 and the sidewall 12. The bottom part 30 has a sidewall 32, a bottom wall 34, a flange 36 at the sidewall 32 and a bearing shaft 38. The bottom part 30 further includes a block 40, a block cover plate 42 and a recess 44 that forms part of the process chamber 61. An insulation material 46 surrounds the block 40 between the bottom wall 34 and the sidewall 32. In one embodiment, the blocks 20, 40 are high-mass blocks (for example, each greater than about 10 times the thermal mass of the substrate for which the reactor 1 is configured) with a high heat capacity. In the closed position, the flanges 16, 36 abut each other and seal the reactor 1.

Further, the reactor 1 includes equipment to heat the blocks 20, 40, the process chamber 61 and the wafer 60 positioned within the process chamber 61 to a predetermined temperature and to maintain this temperature for a predetermined time. It is contemplated that the blocks are maintained at a constant, desired temperature throughout the sequential processing of a series of substrates. However, it is possible to select a desired temperature out of range of predetermined temperatures. The term "controlling the temperature," as used herein, therefore, encompasses the act of increasing the temperature and the act of decreasing the temperature of the reactor 1.

Figure 2A:
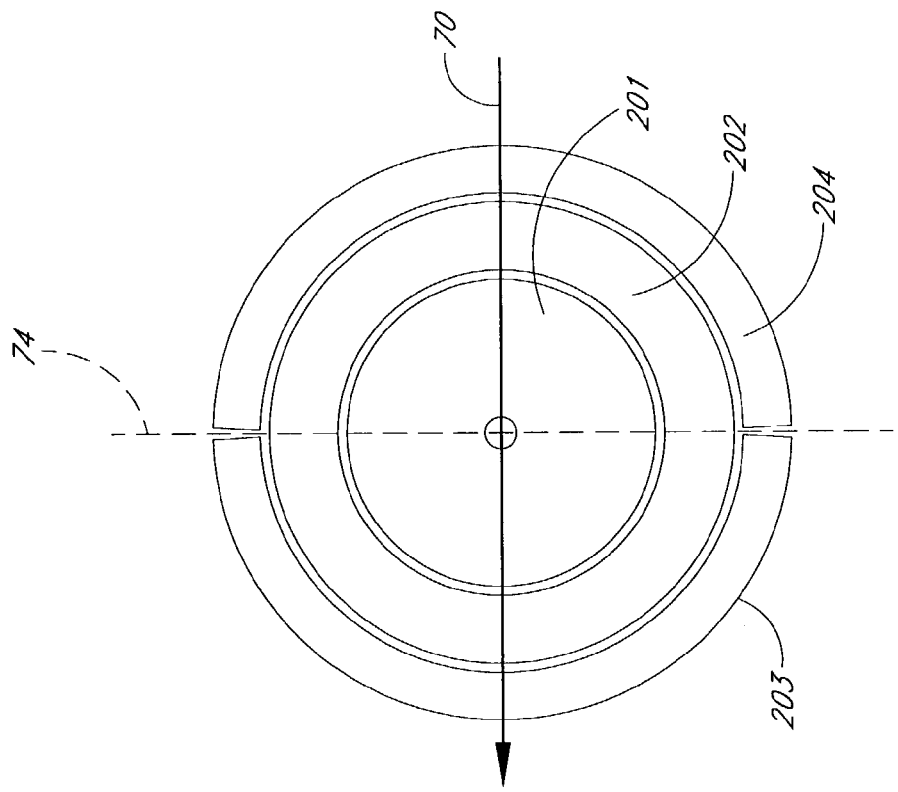
FIGS. 2A-2C are schematic illustrations of the heating zones defined by the heating elements included in the upper part and the bottom part in accordance with three different embodiments, affording asymmetric control over heating across the substrate.
Figure 2A:
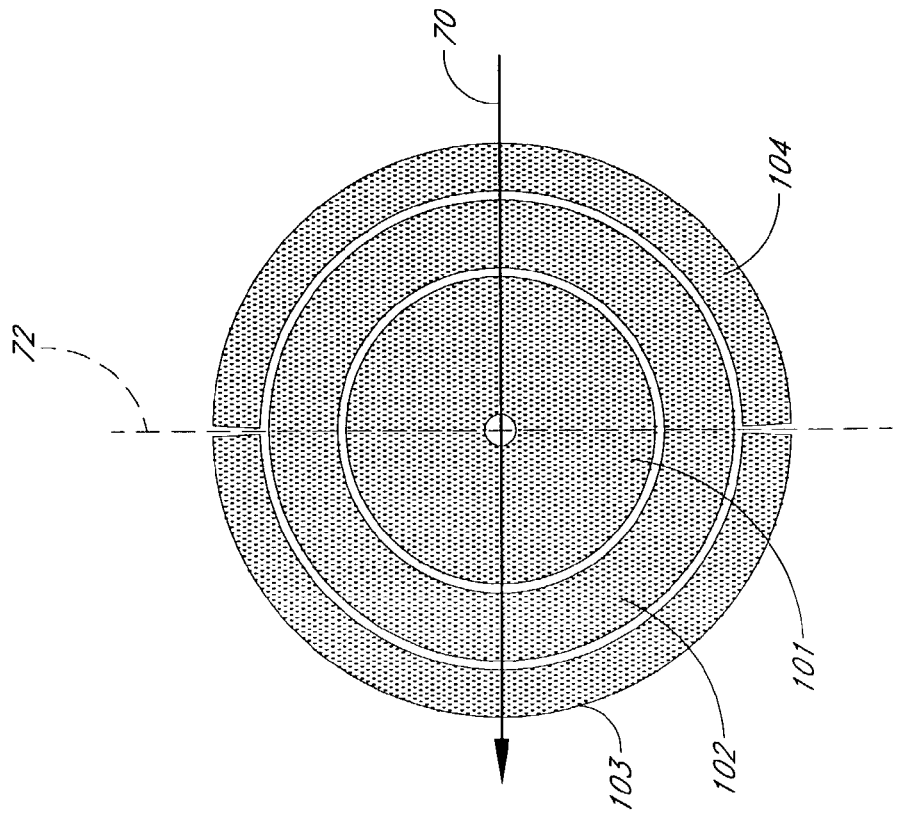
Figure 2B:
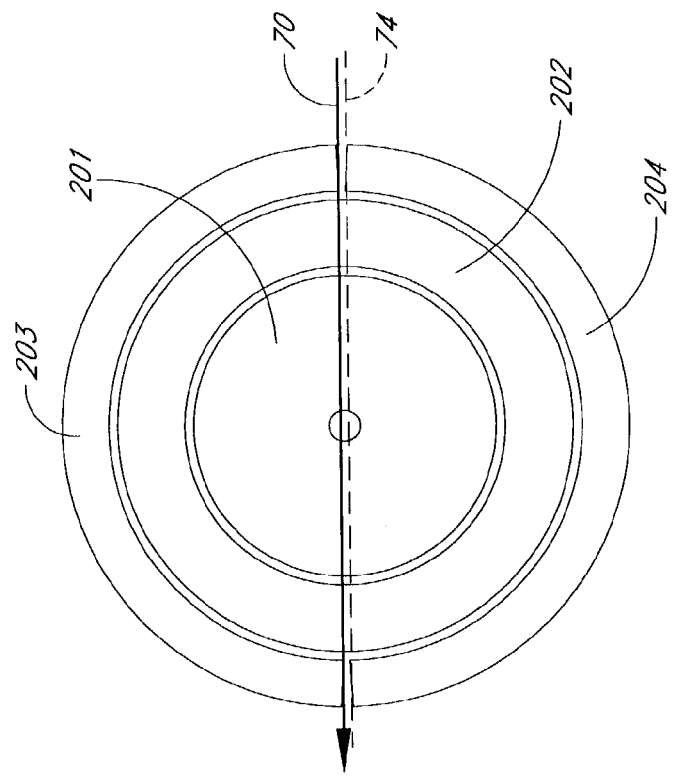
Figure 2B:
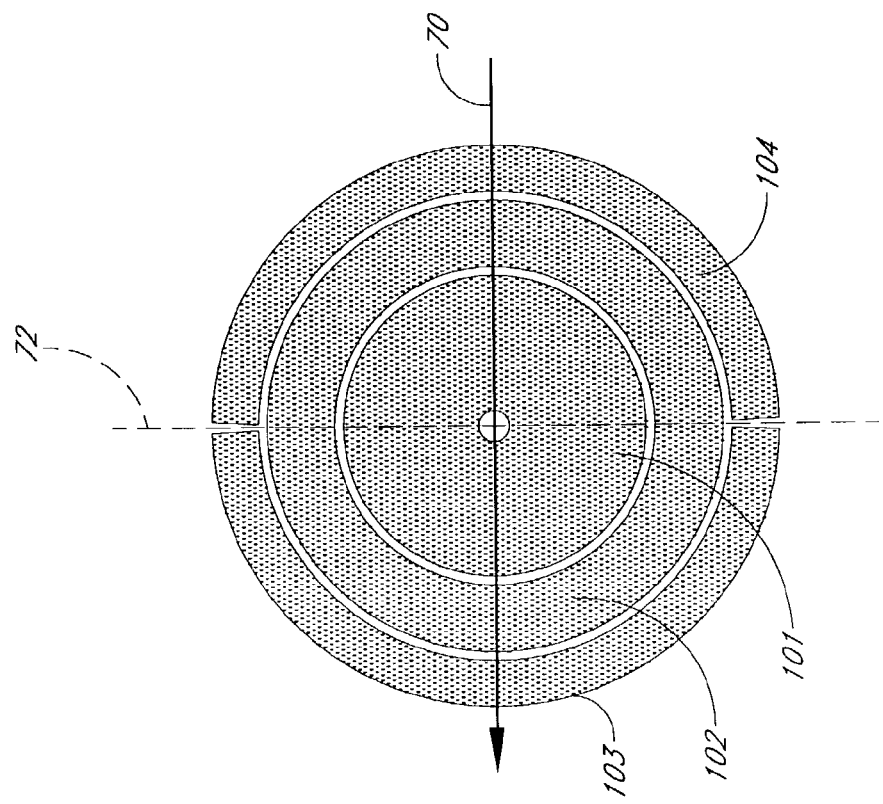
Figure 2C:
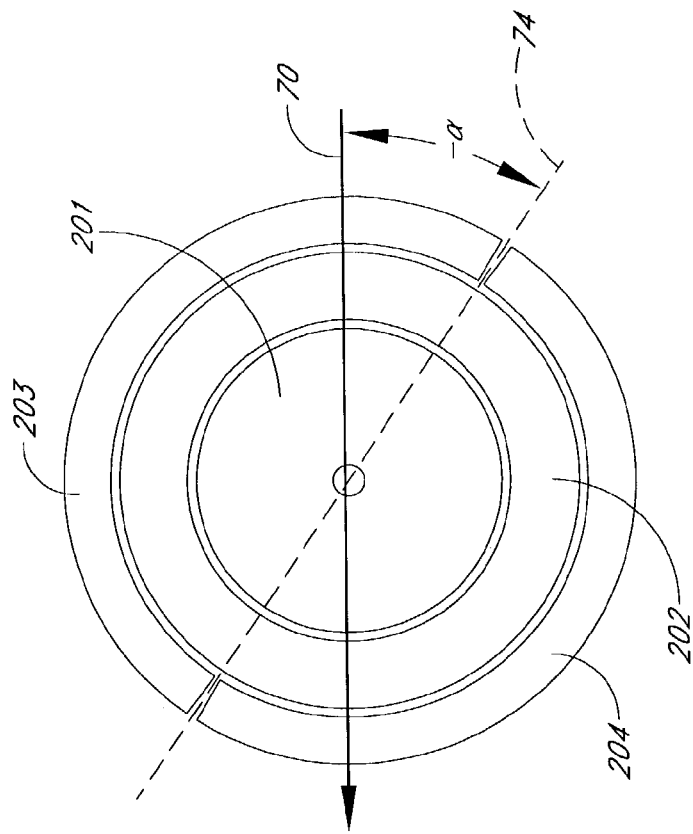
Figure 2C:
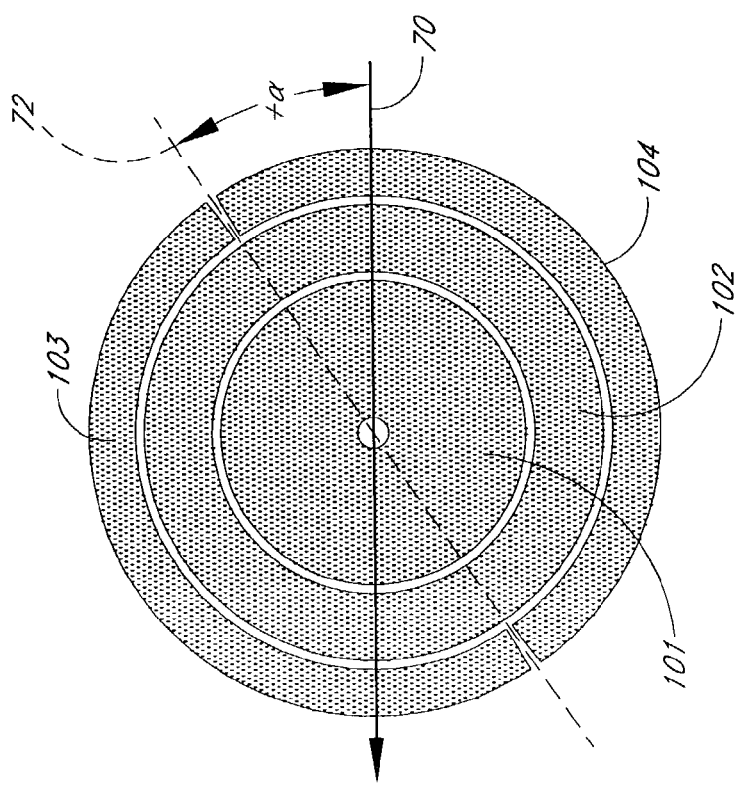

In the illustrated embodiment of the reactor 1, the equipment includes a plurality of heating elements in each of the upper part 10 and the bottom part 30. The upper part 10 includes heating elements 101, 102, 103, 104 that are individually connected to a controller 100 that selectively drives the heating elements 101, 102, 103, 104. While the overall heating system has a central controller 100, the skilled artisan will appreciate that each heating element or zone can have its own direct controller, for example, a PID controller. The heating element 101 defines a first heating zone, the heating element 102 defines a second heating zone, the heating element 103 defines a third heating zone and the heating element 104 defines a fourth heating zone. The bottom part 30 includes heating elements 201, 202, 203, 204 that are positioned opposite to the respective heating elements 101, 102, 103, 104 of the upper part 10. Accordingly, the heating elements 201, 202, 203, 204 define also the first, second, third and fourth heating zones for the bottom part 30. Exemplary arrangements of the heating zones are shown in FIGS. 2A to 2C and described below. Note that, for purposes of the present description, the controller 100 is considered part of the reactor 1, even though the controller may be physically located next to the tool or at a remote location.

In one embodiment, the heating elements 101-104 and 201-204 are configured for resistive heating. For example, one or more wires are embedded in a thermally insulating material that is formed to a predetermined form. The wires may be formed as coils and the material may have a flat, circular shape. It is contemplated that each heating element may be formed by one or more individual sub-elements.

The heating equipment also includes thermocouple assemblies 111, 112, 113, 114 and 115 that are positioned in respective holes 121, 122, 123, 124 and 125, preferably blind holes, in the upper block 20. Each thermocouple assembly 111 to 115 has thermocouple wires 134 to connect each of the thermocouples of the respective assembly to the controller 100. Referring to the thermocouple assembly 114, the thermocouple assembly 114 has a collar 130, and a bracket 132 secures the thermocouple assembly 114 to the upper part 10. A spring 131 between the collar 130 and the bracket 132 urges the thermocouple assembly 114 towards the bottom of the hole 124. The thermocouple assemblies 111, 112, 113 and 115 are positioned and secured within the holes 121, 122, 123 and 125 as described with reference to the thermocouple assembly 114.

The thermocouple assemblies 111 to 115 include thermoelements S1, S2, S3, S4, respectively, positioned close to the heating elements 101-104, preferably within about 10 millimeters or less, away from the heating elements 101-104. The thermocouple assemblies 111, 112 and 113 include further thermocouples P1, P2 and P3, respectively, positioned within the upper block 20 close to the process chamber 61, preferably within about 5 millimeters, more preferably within about 2 millimeters, away from the process chamber 61. The controller 100 uses the thermocouples P1, P2 and P3 to determine the temperature in proximity of the process chamber 61.

As shown in FIG. 1A, the thermoelement P1 is located above a center region of the wafer 60, the thermocouple P2 is located above an edge region of the wafer 60 and the thermocouple P3 is located in an outer region. For zones 101, 102, 103, the input of thermocouple S1 and P1, S2 and P2, S3 and P3, respectively, is used in a cascade type of temperature control, wherein a desired temperature is achieved and maintained at thermocouple P1 to P3. Thermocouple assembly 112 comprises a thermocouple for over heat protection, which is indicated by OHP. The input of this thermocouple is not used for temperature control but for checking and safety purposes only. For zone 104, a single thermocouple is used. In the preferred embodiment, the power fed to the zone 104 is controlled in a master-slave arrangement with the zone 103. The zone 104 receives a fixed percentage of the power sent to zone 103. In standard operation, where no unidirectional gradient is desired, this percentage is typically 100%, which means that zone 104 receives the same amount of power as zone 103.

For ease of illustration, FIG. 1A does not show thermocouple assemblies in the bottom part 30. However, it is contemplated that the bottom part 30 includes thermocouples that are positioned and operate similarly to the thermocouple assemblies 111, 112, 113, 114 and 115 of the upper part 10.

Within the process chamber 61, a ring 62 surrounds and supports the wafer 60. A support ring 64 surrounds the ring 62 and has fingers 65 to mechanically support the wafer 60 and the ring 62 during transfer to and from the reactor 1. In the closed position of FIG. 1A, the ring 62 and the wafer 60 are housed within the process chamber 61 and surrounded by the blocks 20, 40. To load and unload the reactor 1, the bearing shafts 18, 38 spread the upper part 10 and the bottom part 30 apart. In this open position, a load/unload mechanism acts upon the support ring 64 and transfers the wafer 60 and the ring 62 to and from the reactor 1. The loading and unloading of a reactor is described in WO 00/68977, published Nov. 16, 2000, the disclosure of which is incorporated herein by reference.

In one embodiment, the reactor 1 is configured as a floating wafer reactor. Streams of gas flow through a plurality of passages in the blocks 20, 40 and cause the wafer 60 to float during annealing. In another embodiment, the support ring 64 may have spacers that support the wafer during transport and annealing. Either the streams of gas or the spacers position the wafer 60 at a very short distance between the blocks 20, 40 during processing. The distance is preferably smaller than about 2 millimeters, more preferably less than about 1 millimeter, and in one embodiment is about 0.15 millimeters. It is contemplated that the temperature control features described herein are equally applicable in both types of reactor.

In one embodiment, the wafer 60 is configured for annealing (spike or rapid thermal annealing) within the process chamber 61. Applicants noted that the side of a wafer that leaves the reactor first cools down first, while the lagging side of the wafer is still subject to heating by the massive, uniformly heated blocks. Although the removal time is very short, it influences parameters of the wafer, in particular in a situation where the anneal time is of the same order of magnitude as the removal time. The anneal time is herein defined as the time during which the wafer is in close proximity with the heated body. In the illustrated embodiment, the anneal time is that during which a wafer is accommodated in the process chamber and during which the reactor blocks are in a closely spaced or closed position, such that the wafer is at a very small distance from the blocks. In the illustrated embodiment, the wafer removal time is defined as the time during which the wafer is not in close proximity with the heated body anymore, but at least part of the wafer is still facing the heated body. This removal time is shorter than the total loading/unloading time required to load/unload a wafer to/from the reactor from/to another station, which will generally include some transfer time completely outside the blocks. A typical wafer loading/unloading time is about 2.0 seconds. In one arrangement, this time is composed of the following components: horizontal wafer movement completely outside the reactor blocks to a position directly adjacent the reactor blocks or vice versa: 0.7 seconds; horizontal wafer movement from a position directly adjacent to the reactor blocks to a central position between the blocks or vice versa: 0.8 seconds; and movement of the blocks from an open to a closed position or vice versa: 0.5 seconds. Consequently, this results in a wafer removal time according the definition given above of 1.3 seconds.

The controller 100 is programmed to heat the reactor 1 such that during annealing the wafer 60 is exposed to a reactor temperature between about 200° C. and 1150° C. for a period of 0.2 seconds and longer. In one embodiment, the annealing occurs at a reactor temperature that is about 1000° C. for about 1 second. Desirably, the reactor maintains a substantially constant temperature in each zone during a run of sequential wafer treatments, rather than significantly ramping reactor temperatures during each cycle. Thus, despite intentional gradients noted below, the reactor 1 behaves as a hot wall reactor. A small amount of ramping may be required to compensate for the load created by cold wafer loading and losses from opening the chamber.

Figure 1B:
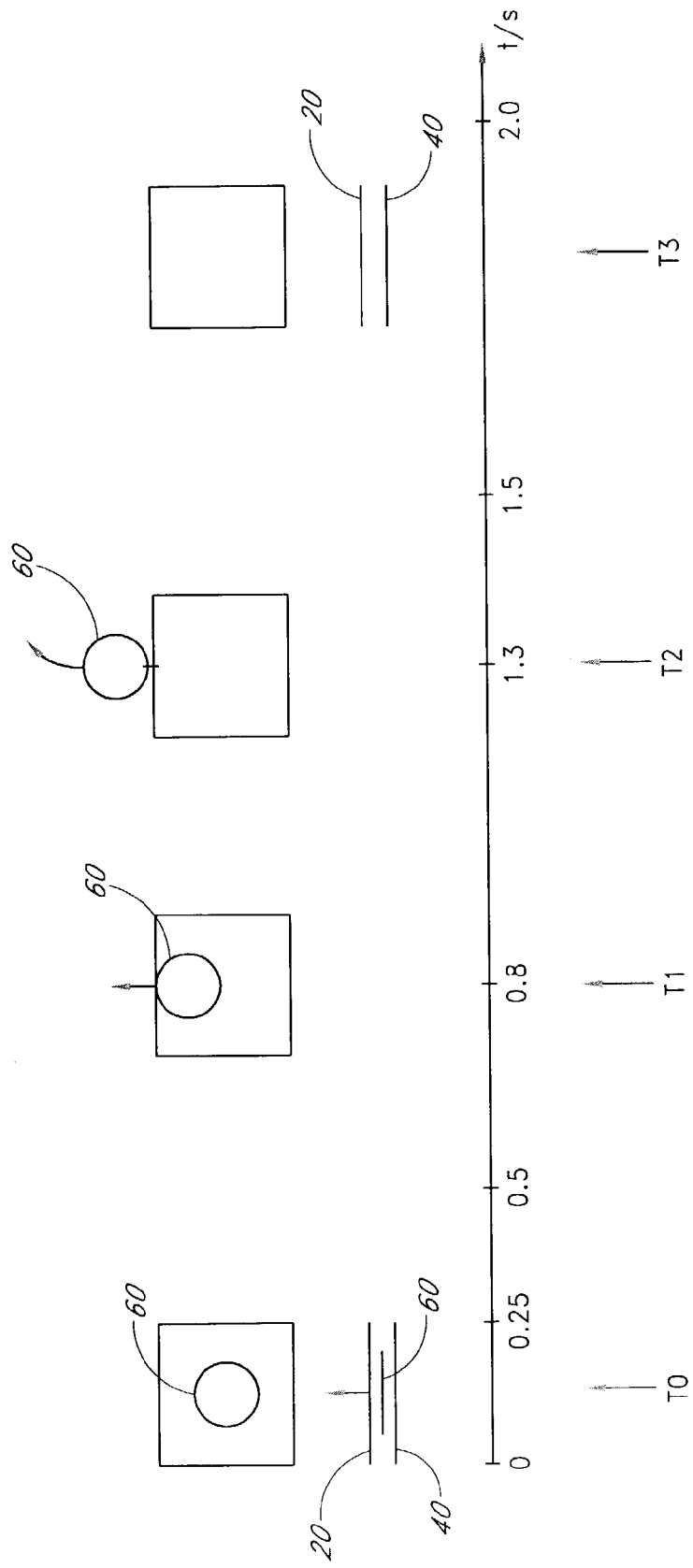
FIG. 1B is schematic illustration of the loading and unloading process as a function of time.

FIG. 1B is schematic illustration of the loading and unloading process as a function of time t. A typical removal time for removal of the wafer 60 from the process chamber 61 is 1.3 seconds. The first 0.5 seconds of the unloading time is used for moving the heated reactor blocks 20, 40 apart from each other, as indicated at time T0. Then the wafer 60 starts to move in a direction parallel to the plane of the wafer 60. During the first 0.3 seconds after the start of the wafer movement, the wafer 60 is still entirely in between the blocks 20, 40. At about 0.3 seconds after the start of the wafer movement, the leading wafer edge has just been removed from between the heated reactor blocks 20, 40, as indicated at time T1. At about 0.8 seconds after the start of the wafer movement, the trailing wafer edge has been removed from between the heated reactor blocks 20, 40, as indicated at time T2. During the first 0.8 seconds of the unloading procedure, when the wafer 60 is still completely between the blocks 20, 40, but the blocks 20, 40 are already in a separated position, the wafer 60 can suffer from a radial temperature gradients due to heat loss by radiation at the wafer edge. By the 2.0 seconds mark, the wafer 60 has been completely unloaded to another station as so the wafer 60 is not shown in the diagram at that stage, as indicated at T3.

While described herein as if the substrate handler accomplishes all substrate movement, the skilled artisan that a combination of other elements can also be involved in the substrate movement (e.g., lift pins, transfer ring, etc.). Ultimately, however, at the end of a loading process or beginning of an unloading process, the substrate is closely spaced (preferably less than 2.0 mm) from the surface of the heated body. Note also that, during wafer unloading, a second wafer (not shown) can be loaded from the side of the reactor opposite that of the unloading side. It will be understood that, in other arrangements, the wafer can be loaded and unloaded from the same side, although the illustrated arrangement improves throughput. It will therefore be understood that, though referred to as "a substrate handler" or "the substrate handler" herein, in reality the substrate handling mechanism can include more than one robot as well as intermediate devices.

During the last 0.5 seconds of the wafer transfer procedure, when part of the wafer 60 has already been removed from between the blocks 20, 40 but another part of the wafer is still between the blocks, the wafer 60 can suffer from a unidirectional temperature gradient in the direction of wafer transfer. The present invention is particularly advantageous in cases where the removal time is greater than 10% of the anneal time and more particularly when the removal time is greater than 30% of the anneal time.

The ring 62, which holds and surrounds the wafer 60, protects the wafer 60 from too strong a radial temperature gradient, i.e., inhibiting the tendency of the edge to cool down too fast with respect to the center region during unloading. Despite the ring's protective function, it has been found that radial temperature gradients still exist, as measured by a resultant non-uniform distribution of the sheet resistivity across the wafer 60. Furthermore, the ring 62 cannot prevent linear temperature gradients during removal. As noted above, it has been found that the side of a wafer that leaves the reactor first cools down first. The linear temperature gradient also causes a non-uniform distribution of the sheet resistivity across the wafer 60.

Accordingly, the preferred reactor 1 provides individual control over temperatures across the heating zones shown in FIGS. 2A-2C, and is thus configured to compensate for the non-uniform sheet resistivity (or other thermally-influenced property) caused by the temperature gradients during unloading. Preferably, therefore, the controller 100 includes a processor and memory programmed to non-uniformly heat the wafer 60 in a specified manner, which is empirically determined prior to programming. Herein, the controller 100 is considered part of the reactor 1, even though the controller may be physically located next to the tool or at a remote location.

FIG. 2A is an exemplary illustration of the heating zones defined by the heating elements 101, 102, 103, 104 included in the upper part 10. In the embodiment of FIG. 2A, it is contemplated that the heating elements 201, 202, 203, 204 of the bottom part 30 define corresponding heating zones. For ease of reference, the heating zones have hereinafter the same reference numerals as the heating elements 101, 102, 103, 104, although it will be appreciated that, in practice, each zone can include multiple heating elements. The heating zones 101, 102, 103, 104 cover a circular area with the bearing shaft 18 as center, wherein the circular area extends in the illustrated embodiment beyond the wafer 60, as shown in FIG. 1A. The heating zone 101 is the innermost disk-like heating zone that is surrounded by the annular or ring-shaped heating zone 102. The heating zones 103, 104 are both cone or ring segments that extend along the periphery of the heating zone 102 and are located at opposite sides of a center line 72 through the upper block 20, wherein the center line 72 is parallel to the surfaces of the blocks 20, 40 and normal to the direction 70 of substrate loading and unloading. Similarly, the heating zones 203, 204 are both cone or ring segments that extend along the periphery of the heating zone 202 and are located on opposite sides of a center line 74 through the lower block 40. In FIG. 2A, the heating zone 103 is on the left-hand side, and the heating zone 104 is on the right-hand side. The heating zones 103, 104, thus, permit asymmetric heating profiles across the wafer 60.

These heating zones 101, 102, 103, 104 and the corresponding heating zones in the bottom part 30 provide for a predetermined temperature gradient across the blocks 20, 40 and the wafer 60 during annealing so that the thermal effect of the unloading process is compensated. Each heating zone 101, 102, 103, 104 has its own thermoelement S1-S4 and control loop associated with the controller 100. In one embodiment, the controller 100 can selectively control the heating zones 101, 102, 103, 104 to apply a unidirectional or "linear" temperature gradient, a radial temperature gradient, or a combination of a linear and radial temperature gradients. The controller 100 preferably applies these temperature gradients at steady state.

In a further embodiment it was found to be particularly advantageous to split the heating elements of the upper part in a different way than the heating elements of the lower part. This is illustrated in FIGS. 2B and 2C. In FIG. 2B, the upper heating elements 103 and 104 are located at opposite sides of a center line 72 through the upper block 20, wherein the center line 72 is parallel to the surface of upper block 20 and normal to the direction 70 of substrate loading and unloading. When the lower heating elements 203 and 204 are oriented in the same sense, the temperature tuning possibilities of the upper and lower blocks are identical and act in the same direction. However, it is found that the desired direction of a temperature gradient is not always in a direction exactly parallel to the direction of substrate loading and unloading. This might be due, for example, to, slight asymmetries in the hardware, in the gas flows patterns or in other parameters not presently known. It should be emphasized that the non-uniformities in process results are small, requiring only small temperature adjustments of a few degrees (° C.).

By orienting upper heating elements 103 and 104 differently from lower heating elements 203 and 204, the direction of the overall temperature gradient over the wafer during processing can be tuned. The maximum tuning possibility is obtained when the orientation of upper heating elements 103 and 104 is rotated by 90 degrees with respect to the orientation of lower heating elements 203 and 204, as shown in FIG. 2B. Thus, in FIG. 2B, the center line 72 of the upper heating elements 103, 104 is perpendicular to the direction 70 of substrate movement, whereas the center line 74 of the lower heating elements 203, 204 is parallel to the direction 70 of substrate movement.

With reference now to FIG. 2C, the orientations of the heating upper and lower elements 103, 104 and 203, 204 can also be in mirror symmetry with respect to the direction of substrate loading and unloading. For example, upper heating elements 103 and 104, can be located at opposite sides of a center line 72 line that makes an angle α with the direction 70 of substrate loading, while lower heating elements 203, 204 can be located at opposite sides of a line 74 that makes an angle-α with the direction 70 of substrate loading. Any other different type of heating element splitting can be applied, as circumstances require. Although the temperature gradients of the upper block and the lower block do not reinforce each other in this way, it was found that applying a temperature gradient on only one of the blocks can give sufficient effect to compensate the uneven thermal budget that arises during loading and unloading. Which block to employ asymmetrically for such compensation then depends upon the asymmetry of process results encountered for a given process.

FIGS. 2A-2C thus illustrate different manners in which unidirectional or linear temperature gradients can be applied to the wafer. In FIG. 2A, two unidirectional gradients can be applied (from above and below the substrate), and they are both parallel to each other and to the direction 70 of substrate loading/unloading. In FIG. 2B, one unidirectional gradient can be applied parallel to the direction 70 of substrate loading/unloading, while a second unidirectional gradient can be applied perpendicular to the direction 70 of substrate loading/unloading. In FIG. 2C, two unidirectional gradients can be applied at an angle to one another and to the direction 70 of substrate loading/unloading. Preferably, as illustrated, the two unidirectional gradients are at opposite and symmetrical angles with respect to the direction 70 of substrate loading/unloading.

Figure 3:
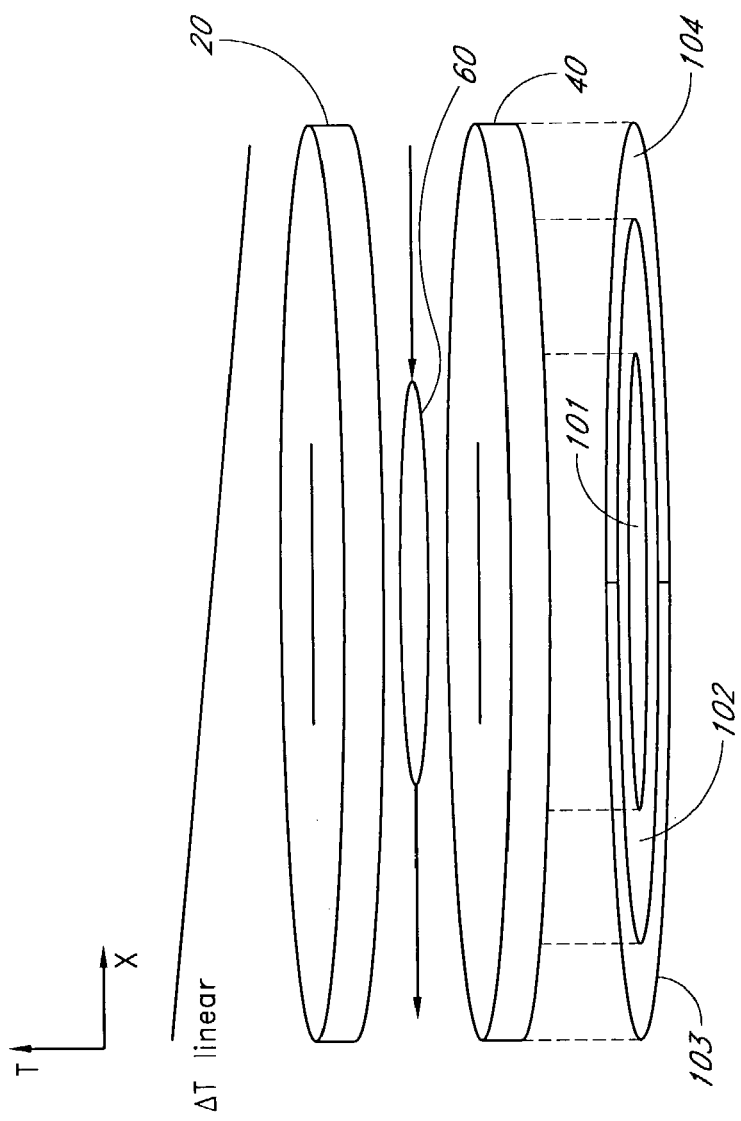
FIG. 3 is a schematic illustration of a reactor with heating zones shown in relationship to an induced unidirectional temperature profile to compensate for an uneven temperature distribution during unloading in accordance with a preferred method of operation.

FIG. 3 schematically illustrates that the linear temperature gradient ($\Delta T_{linear}$) extends in a direction substantially parallel to the direction of loading on the right-hand side and unloading on the left-hand side between the blocks 20, 40. It will be understood that the gradient might not be exactly linear. Rather, the temperature gradient is substantially unidirectional, with a continuously increasing temperature in the direction of wafer removal, and no substantial temperature gradients in a direction perpendicular to the direction of wafer removal. For ease of reference, this temperature gradient is referred to as a "linear" gradient. For illustrative purposes, the temperature gradient ($\Delta T_{linear}$) is illustrated above the block 20, and the heating zones 101-104 are illustrated below the block 40. The controller 100 drives the heating zones 101, 102 and 103 according to a closed loop temperature control with a temperature setpoint. In the specific embodiment, the heating zone 104 is driven according to a master/slave configuration with the zone 103 with varying power ratios. For example, if a power ratio of 100% is defined, the controller 100 drives both peripheral heating zones 103, 104 with the same power, causing essentially the same temperature. The amount of power is such that the temperature setpoint of the zone 103 is achieved. When the power ratio is less than 100%, the controller 100 drives the heating zone 104 with less power than the heating zone 103.

In one embodiment, the controller 100 intentionally applies a power ratio of less than 100%, for example, 92%, to cause the unidirectional temperature gradient, preferably linear, across the blocks 20, 40. The temperature at the unloading (left) side of the blocks 20, 40 is therefore a few degrees higher than the temperature at the opposing (right) loading side. With reference to FIG. 2A, the heating zone 103 has a higher temperature than the heating zone 104. The heating zones 101, 102 have temperatures according to predetermined temperature setpoints. In one embodiment, the temperature gradient extends between high and low temperatures with a temperature difference between about 1° C. and 5° C., more preferably between about 2° C. and 3° C.

The slope ($\Delta T/\Delta x$) of the linear temperature gradient ($\Delta T_{linear}$) is opposite in sign to the inherent temperature gradient affecting the wafer 60 during unloading. If the anneal time and unload time are about equal, the temperature gradients are about equal in magnitude and opposite in sign. For unequal times, the skilled artisan can readily determine the appropriate gradients to apply through routine experimentation. Therefore, the linear temperature gradient ($\Delta T_{linear}$), which provides for a "hotter" unloading side, compensates for the uneven cool-down of the wafer's leading and trailing sides during unloading. As a result, the wafer 60 has an improved sheet resistivity uniformity across the wafer 60.

Figure 4:
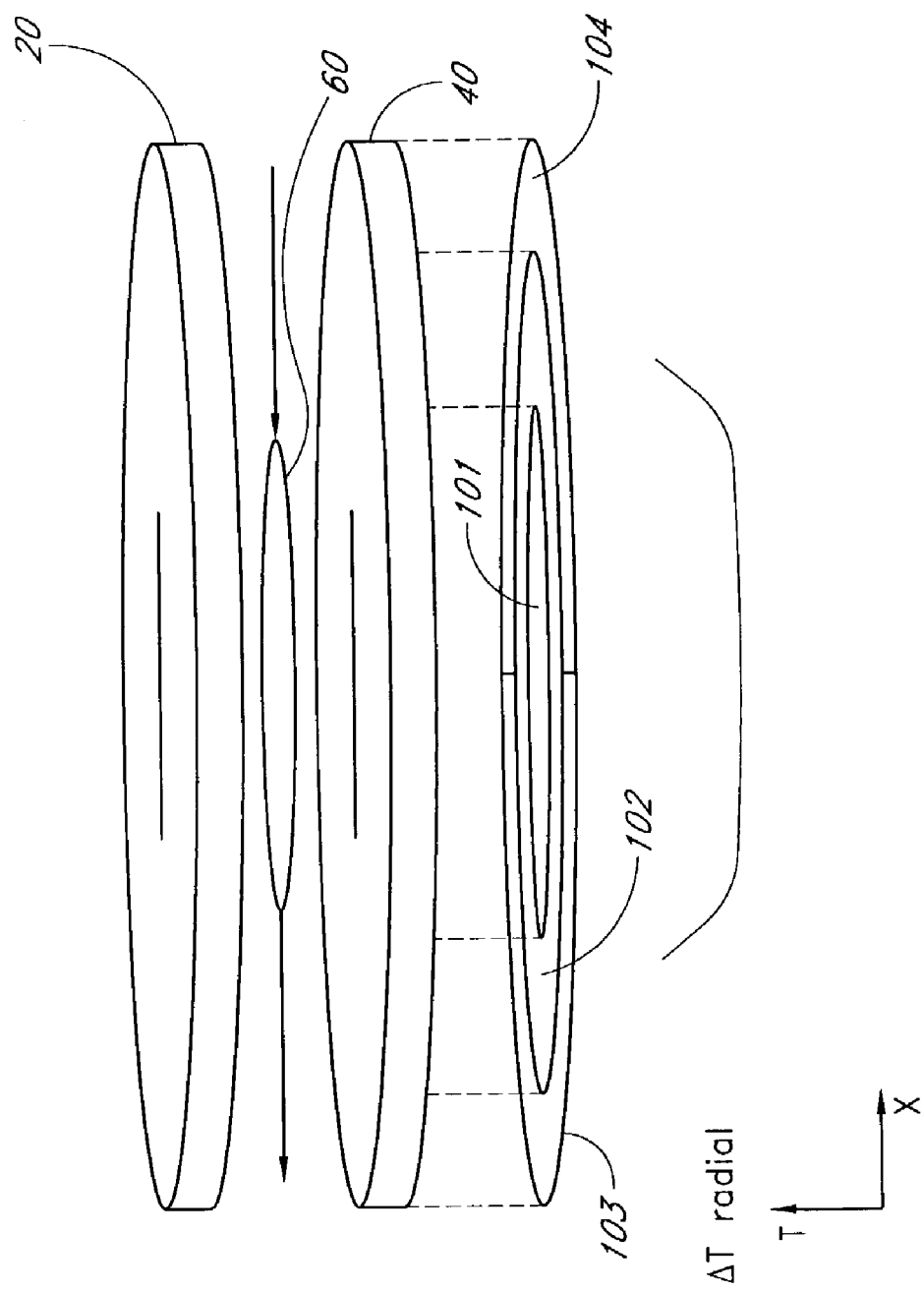
FIG. 4 is a schematic illustration of a reactor with heating zones shown in relation to an induced a radial temperature profile to compensate for an uneven temperature distribution in accordance with another preferred method of operation.

FIG. 4 schematically illustrates a radial temperature gradient ($\Delta T_{radial}$) extending radially from the center to the wafer edge between the blocks 20, 40. For illustrative purposes, the radial temperature gradient ($\Delta T_{radial}$) and the heating zones 101-104 are illustrated below the block 40. In this case, the controller 100 drives the central heating zone 101 with a somewhat lower temperature setpoint than the annular zone 102 near the wafer periphery to cause a radial temperature gradient across the blocks 20, 40. The temperature at the wafer edges is therefore a few degrees higher than the temperature at the wafer center. Similar to the linear temperature gradient, the radial temperature gradient compensates for the uneven cool-down of the wafer's edge and center during unloading. In one embodiment, the temperature difference over the radial temperature gradient is preferably between about 1° C. to 5° C., more preferably between about 2° C. and 3° C. The zones 103 and 104 can be driven with a power ratio of 100%, and a selected temperature setpoint for zone 103. It should be noted that during processing, the wafer 60 extends only over the zone 101. The difference in temperature setpoint for the zones 101 and 102 results in a temperature gradient in the radial direction in the border region of these two zones. Consequently, the wafer 60 will not experience the full difference in temperature difference but only a certain fraction of it.

FIGS. 3 and 4 illustrate the separate application of the linear temperature gradient ($\Delta T_{linear}$) and the radial temperature gradient ($\Delta T_{radial}$). However, it is contemplated that in certain embodiments, the controller 100 can apply both a radial temperature gradient ($\Delta T_{radial}$) and a linear temperature gradient ($\Delta T_{linear}$) at the same time.

Figure 5:
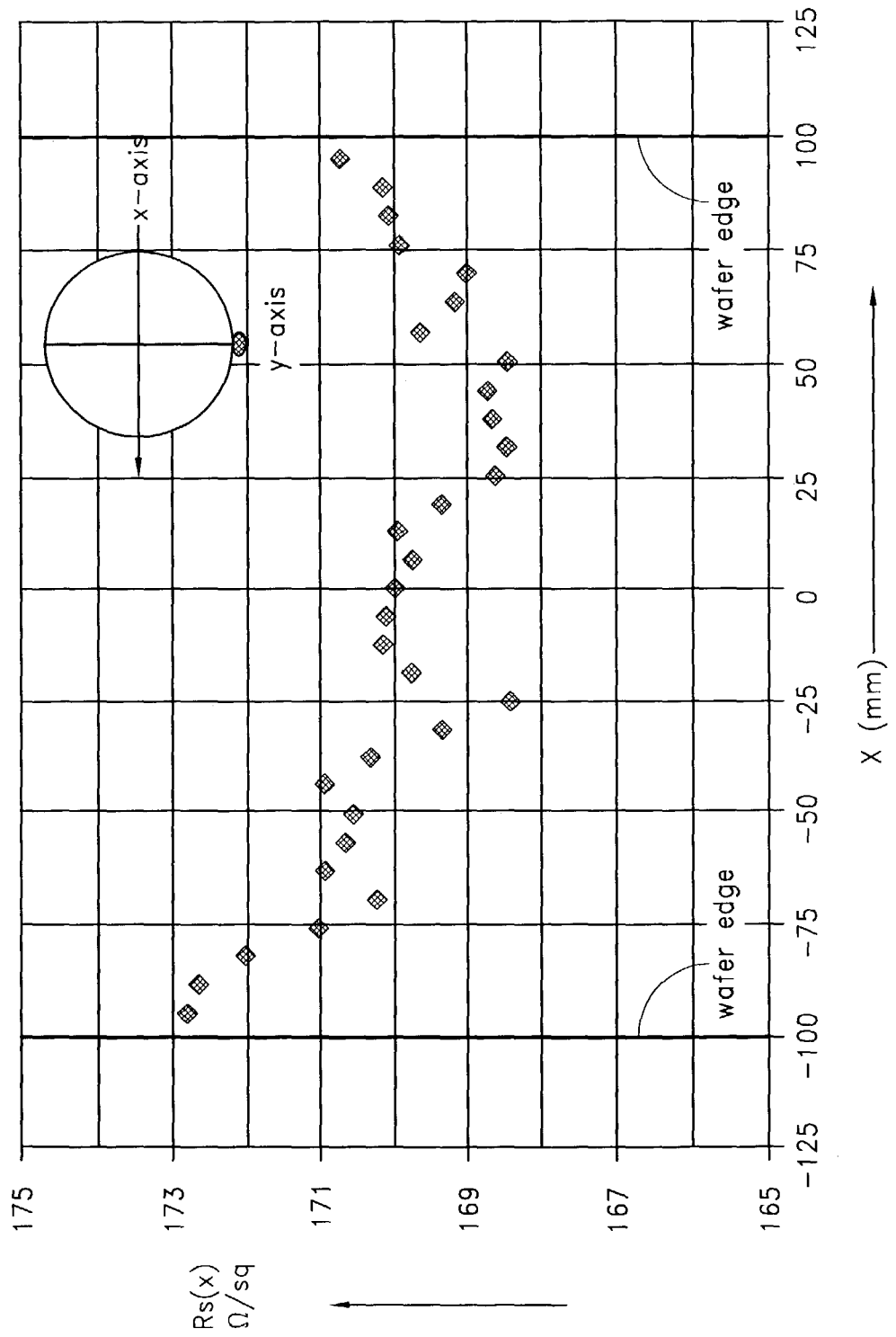
FIG. 5 is a graph showing a sheet resistivity across a wafer as a function of position after annealing in an anneal station without an applied temperature gradient.
Figure 6:
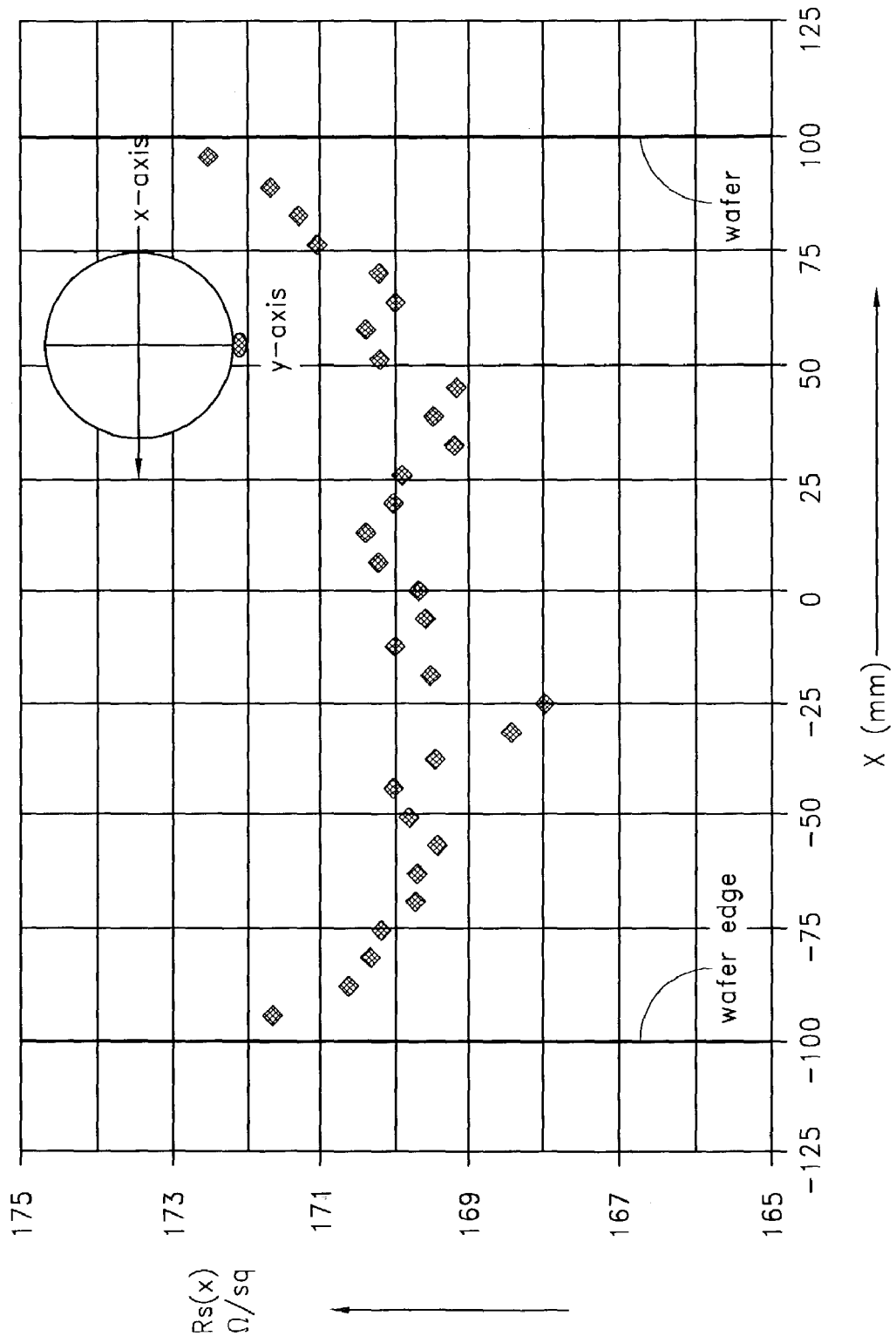
FIG. 6 is a graph showing a sheet resistivity across a wafer as a function of position after annealing in an anneal station with an applied unidirectional temperature gradient.
Figure 7:
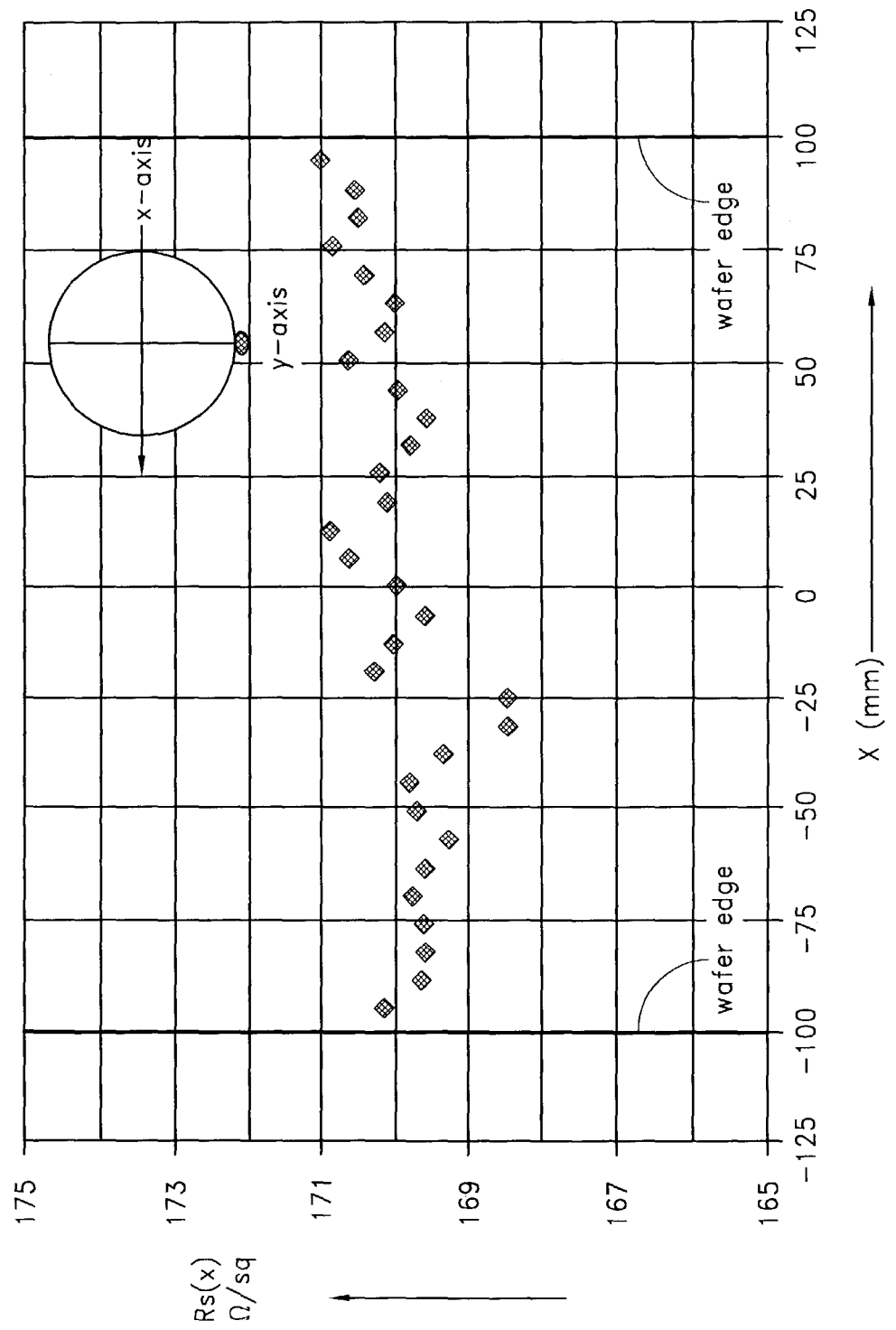
FIG. 7 is a graph showing a sheet resistivity across a wafer as a function of position after annealing in an anneal station with applied unidirectional and radial temperature gradients.

FIGS. 5, 6 and 7 show graphs of a wafer's sheet resistivity Rs[Ω/sq] as a function of position x [mm] across the wafer 60 having a diameter of 200 millimeters to illustrate the improvement provided by applying a temperature gradient. In the examples shown, the wafer was implanted with single, positively charged boron ions, with an energy of 5 keV and a dose of 1.15 cm⁻². The wafers were subjected to a heat treatment of 1100° C. for 1.22 seconds. The wafer removal time was about 1.2 s.

In FIG. 5, the controller 100 does not apply a temperature gradient and the sheet resistance varies substantially across the wafer 60 resulting in a 1 sigma (σ) variation of 1.26%, wherein a is the sample standard deviation used in statistics. Without wanting to be limited by theory, the inventors believe this variation is due to a non-uniform thermal effect during unloading. In contrast, in FIG. 6, a linear temperature gradient is applied that reduces the variance of the sheet resistance substantially to a 1 sigma variation of 0.96%. In one embodiment, the power ratio of the heating zones 103, 104 is 92% causing a linear temperature gradient. FIG. 7 illustrates the sheet resistivity when the controller 100 applies a combined linear temperature gradient and a radial temperature gradient. In one embodiment, the power ratio between the heating zones 103, 104 is 92% and the temperature setpoint for the zone 102 was 2.5° C. degrees higher than the setpoint for the zone 101. The combined gradients further improve the uniformity of the sheet resistivity to a 1 sigma variation of 0.85%.

Although we have mentioned the temperature setpoints, power ratio and heating zones of the upper block only, it should be understood that the controller 100 controls the temperatures and power ratio for the lower block in an identical way, with the settings for a zone in the lower block being identical to the settings for the corresponding zone in the upper block.

Figure 8:
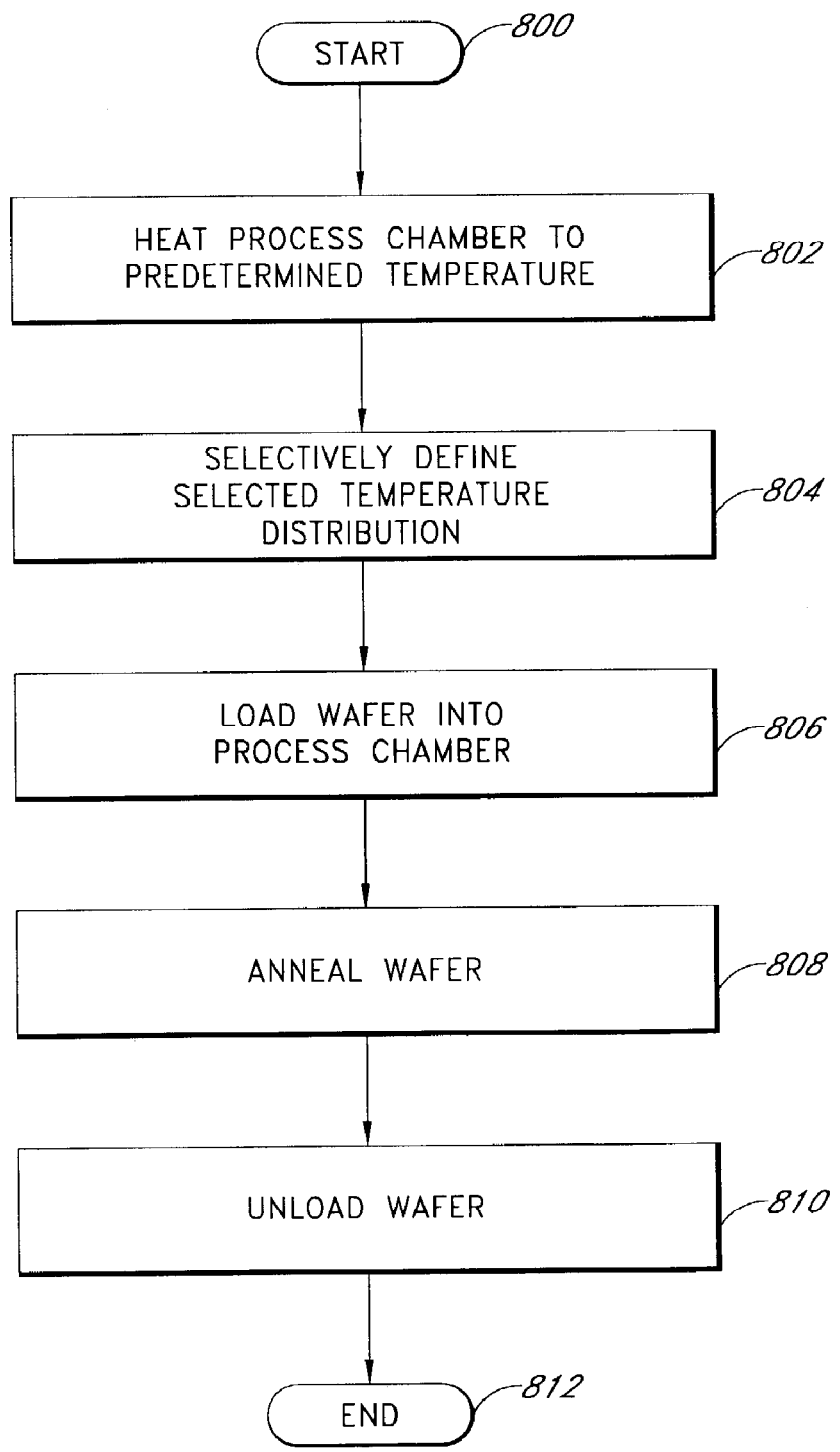
FIG. 8 is a flowchart of a method of operating a reactor to provide for compensation of uneven temperature profiles.

FIG. 8 is a flowchart of a procedure that illustrates a method of operating a reactor with a compensation for uneven temperature distributions during unloading the wafer. In a step 800, the method initializes and performs one or more system tests to determine, for example, if the controller 100 receives a, signal from each of the thermocouples 111-114.

In a step 802, the heating elements 101-104 and 201-204 operate to heat the process chamber 61 to a predetermined temperature. In one embodiment, the controller 100 drives each heating element with an amount of electrical power that the respective heating element converts into thermal energy. The thermal energy heats the high-mass blocks 20, 40 and thus the process chamber 61. The controller 100 drives the heating elements 101-104, 201-204 as a function of the temperatures measured by the thermocouple assemblies 111-115. In one embodiment, the reactor 1 is in the closed position while heated to a predetermined temperature of, for example, 1000° C.

In a step 804, the controller 100 selectively operates the heating elements 101-104, 201-204 to define a non-uniform temperature distribution. Preferably, the distribution provides at least one of a predetermined unidirectional temperature gradient and a predetermined radial temperature gradient set to compensate for an uneven temperature distribution during removal of a wafer from the process chamber. In one embodiment, the controller 100 determines whether an operator requested a unidirectional or a radial temperature gradient, or a combination of a unidirectional and a radial temperature gradient.

Depending on the operator's request, the controller 100 drives each of the heating elements 101-104, 201-204 with an amount of electrical power such that the required temperature setpoints are achieved. The controller monitors the thermoelements P1, S1, P2, S2, S3, S4 to adjust the power supplied to the heating elements 101-104, 201-204. For example, for a linear temperature gradient the controller 100 applies a power ratio of 92%, which means that the zone 104 will receive 92% of the power sent to the zone 103, and the zone 204 will receive 92% of the power sent to the zone 203, so that the temperature at the unloading (left) side of the blocks 20, 40 is a few degrees higher than the temperature at the opposing (right) side.

In a step 806, the handling apparatus loads the wafer 60 into the process chamber 61. The handling apparatus opens the reactor 1 by separating the upper part 10 and the lower part 30. In the resulting gap, the handling apparatus transports the wafer 60 to and from the process chamber 61. Once the wafer 60 is inserted into the process chamber 61, the handling apparatus closes the reactor 1. In one embodiment, the reactor 1 is floating wafer reactor in which streams of gas lift the wafer 60 from a support structure so that the wafer 60 floats.

In a step 808, the reactor 1 anneals the wafer 60 in the process chamber 61 for a predetermined period of time, wherein the wafer is subject to a non-uniform heating. Preferably, the temperature distribution provides at least one of the predetermined linear temperature gradient and the predetermined radial temperature gradient. In one embodiment, the wafer is subject to spike or rapid thermal annealing. That is, the wafer 60 is exposed to the process temperature of about 1000° C. for less than 10 seconds.

In a step 810, the central apparatus controller unloads the wafer 60 after the predetermined period of time. The handling apparatus unloads the wafer 60 from the process chamber 61 in a fraction of a second, for example, in 0.5 seconds. The handling apparatus unloads the wafer 60 to a cool down section. The handling apparatus is in one embodiment a handling apparatus as described in WO 00/68977, the disclosure of which is incorporated herein by reference. The method ends in a step 812.

Although the foregoing invention has been described in terms of certain preferred embodiments, other embodiments will become apparent to those of ordinary skill in the art in view of the disclosure herein. For example it will be possible that the heat treatment reactor comprises only one heated body with a substantially flat surface facing the substrate. It is also possible that the substrate is during treatment not floatingly supported by gas flows but mechanically supported on the substantially flat surface of the heated body. Accordingly, the present invention is not intended to be limited by the recitation of preferred embodiments, but is intended to be defined solely by reference to the appended claims.

We claim:

1. A reactor for heat treatment of a flat substrate, comprising:

a first heated body having a substantially flat surface facing and sized to extend substantially over an entire first side of a flat substrate during processing, a second heated body having a substantially flat surface facing and sized to extend substantially over an entire second side of the flat substrate during processing, wherein the heated bodies have a thermal mass greater than about 10 times a thermal mass of the substrate;

a substrate handling mechanism configured to place the flat substrate to be processed parallel to, spaced from and in close proximity to the substantially flat surface of the heated body, and configured to remove said substrate in a removal direction from the heated body after processing;

a plurality of heating elements configured to heat the heated bodies, the heating elements being arranged to define at least two individually controlled heating zones for each of the heated bodies;

a plurality of thermocouples configured to sense temperatures of the heating elements and the heated bodies; and a controller connected to the heating elements and to the thermocouples of the first and second heated bodies, the controller controlling the heating elements and programmed to establish a first non-uniform temperature distribution laterally across an area of the flat surface of the first heated body facing the flat substrate during processing and a second non-uniform temperature distribution laterally across an area of the flat surface of the second heated body facing the second side of the flat substrate surface during processing, the first non-uniform temperature distribution oriented in a first direction and the second non-uniform temperature distribution oriented in a second direction, the first and second directions different from each other, wherein the first direction is at an angle of about α to the removal direction and the second direction is at an angle of about −α to the removal direction to permit compensation for a non-uniform thermal effect during loading and/or unloading upon the substrate in the direction of substrate removal,
wherein the heated bodies delimit a process chamber for accommodating the substrate, wherein the heated bodies are disposed at least partly between the process chamber and the heating elements, wherein the heated bodies are configured to absorb heat from the heating elements and to reradiate heat energy to heat the substrate.

2. The reactor of claim 1, wherein the non-uniform temperature distribution is selected to compensate for a non-uniform thermal effect during processing, the non-uniform temperature resulting in uniform thermal processing of the substrate.

3. The reactor of claim 1, wherein the heating zones define a circular area that extends beyond a circular area of the substrate, wherein a first heating zone is a disk-like center heating zone that is surrounded by an annular second heating zone, wherein a third heating zone and a fourth heating zone are annular segments that extend along a periphery of the heated body and are located at opposite sides of a center line through the heated body.

4. The reactor of claim 3, wherein the first, second, third and fourth heating zones are defined on a first side of the substrate, further comprising an other similar set of first, second, third and fourth heating zones of an other heated body on an opposite side of the substrate, wherein the other third heating zone and the other fourth heating zone are annular segments that extend along a periphery of the other heated body and are located at opposite sides of an other center line through the other heated body.

5. The reactor of claim 1, wherein the controller is programmed to define a unidirectional temperature gradient that causes a temperature difference of between 1° and 5° C. across the heated body during processing.

6. The reactor of claim 1, wherein the controller is programmed to define a unidirectional temperature gradient that causes a temperature difference of between 2° and 3° C. across the heated body during processing.

7. The reactor of claim 1, wherein the controller is programmed to define a radial temperature gradient that causes a temperature difference of between about 1° and 5° C. between a center of the heated body and an edge of the heated body.

8. The reactor of claim 1, wherein the controller is programmed to define a radial temperature gradient that causes a temperature difference of between about 2° and 3° C. between a portion of the heated body adjacent a center of the substrate and a portion of the heated body adjacent an edge of the substrate.

9. The reactor of claim 1, wherein the heating zones provide a unidirectional temperature gradient and a radial temperature gradient.

10. The reactor of claim 1, configured to space the substrate at a distance of about two millimeters from the surface of the heated body during processing.

11. The reactor of claim 1, wherein the substrate handling mechanism places the substrate at a distance of about one millimeter from the surface of the heated body.

12. The reactor of claim 1, wherein the substrate handling mechanism places the substrate at a distance of about 0.15 millimeters from the surface of the heated body.

13. The reactor of claim 1, wherein the controller is programmed to provide for rapid thermal annealing of the substrate.

14. The reactor of claim 13, wherein the controller is programmed to anneal the substrate for less than about ten seconds.

15. The reactor of claim 13, wherein the controller is programmed to anneal the substrate for less than about one second.

16. The reactor of claim 13, wherein a ratio of anneal time to removal time is smaller than 10:1.

17. The reactor of claim 13, wherein a ratio of anneal time to removal time is smaller than 3:1.

18. The reactor of claim 13, wherein the controller is programmed to unload the substrate from the process chamber and transfer it to another station within about two seconds.

19. The reactor of claim 1, wherein the thermocouples are disposed within the heated bodies.

20. The reactor of claim 1, wherein the controller is programmed to maintain the first and second non-uniform temperature distributions at a steady state during processing.

21. A reactor for heat treatment of a flat substrate, comprising:
a substrate enclosing structure having an upper part and a bottom part, the upper and bottom parts defining a process chamber, the upper and bottom parts configured to separate for loading and unloading a flat substrate along a loading/unloading direction;
a support structure configured to position the substrate between the upper part and the bottom part, the substrate having major surfaces within about 2 mm of each of the upper part and the bottom part within the process chamber during processing; and
a plurality of heating elements configured to heat the upper and lower parts, wherein the heating elements are arranged to define heating zones, wherein each heating zone is configured to extend only over a portion of the upper and bottom parts;
a plurality of thermocouples configured to independently sense temperatures of the heating elements and of at least one of the upper and bottom parts; and
a controller connected to the heating elements individually and to the thermocouples, the controller being programmed to provide non-uniform temperature distributions across the upper and bottom parts during processing of the substrate, the non-uniform temperature distributions of the upper part oriented in a first direction and the non-uniform temperature distribution of the bottom part oriented in a second direction and in fixed relation to the loading/unloading direction to permit compensation for a non-uniform thermal effect upon the substrate in the loading/unloading direction of substrate removal, wherein the first direction is at an angle of about α to the loading/unloading direction and the second direction is at an angle of about −α to the loading/unloading direction,
wherein the upper and lower parts are disposed at least partly between the process chamber and the heating elements, wherein the upper and lower parts are configured to absorb heat from the heating elements and to reradiate heat energy to heat the substrate.

22. The reactor of claim 21, wherein the controller is programmed to additionally provide for a radial temperature gradient across at least one of the upper and lower parts adjacent to the substrate 23. The reactor of claim 21, wherein the support structure includes spacers to support the substrate.

24. The reactor of claim 21, wherein the support structure includes a plurality of gas flow openings in the upper part and the lower part arranged to support a substrate upon gas cushions above and below the substrate during processing.

25. A reactor for heat treatment of a flat substrate, comprising:
- a first heated body having a substantially flat surface on a first side facing a first side of a flat substrate during processing, the substantially flat surface delimiting a process chamber, the substantially flat surface having a first plurality of gas discharge holes extending therethrough configured to discharge gas onto the first side of the flat substrate;
- a second heated body facing a second side of the flat substrate, wherein the second side is opposite the first side;
- a substrate handling mechanism configured to place the flat substrate to be processed parallel to and in close proximity to the substantially flat surface of the first heated body, and configured to remove the substrate in a removal direction from the first heated body after processing;
- a plurality of heating elements configured to heat the first heated body and a plurality of heating elements associated with the second heated body, the heating elements being arranged to define heating zones and being connected to a controller configured to control the heating elements; and
- a plurality of thermocouples positioned to sense temperatures of the at least one of the first and second heated bodies,
- wherein the controller is programmed to define a first unidirectional temperature gradient laterally across the first heated body and a second unidirectional temperature gradient laterally across the second heated body, wherein the first unidirectional temperature gradient is applied at an angle to the second unidirectional temperature gradient, and wherein each of the first unidirectional temperature gradient and the second unidirectional temperature gradient is oriented in a fixed relation to the removal direction to permit compensation for a non-uniform thermal effect during loading and/or unloading upon the substrate in the direction of substrate removal, wherein the first unidirectional temperature gradient is at an angle of about $\alpha$ to the removal direction and the second unidirectional temperature gradient is at an angle of about $-\alpha$ to the removal direction,
- wherein the heating elements are disposed on an opposite side of the flat surface from the process chamber, wherein the first and second heated bodies are configured to absorb heat from the heating elements and to reradiate heat energy to heat the substrate.

26. The reactor of claim 25, wherein the heating zones associated with the first heated body define a circular area extending beyond a circular area of the substrate and wherein the heating zones associated with the second heated body define a circular area extending beyond the circular area of the substrate, wherein the heating zones associated with the first and second heated bodies each comprise:
- a first heating zone that is a disk-like benter heating zone;
- a second annular heating zone that surrounds the first heating zone; and
- third and fourth heating zones, wherein the third and fourth heating zones are annular segments extending along a periphery of the associated heated body, the third and fourth heating zones associated with the first heated body are located at opposite sides of a first center line through the first heated body, and the thirds and fourth heating zones associated with the second heated body are located at opposite sides of a second center line through the second heated body.

27. The reactor of claim 26, wherein the first center line is at an angle to the second center line.

28. The reactor of claim 25, wherein the second heated body comprises a second plurality of gas discharge holes.

29. The reactor of claim 28, wherein the first and the second plurality of gas discharge holes are configured to support the substrate on a gas cushion.

30. A reactor for heat treatment of a flat substrate, comprising:
- a first heated body having a substantially flat surface on a first side facing a first side of a flat substrate during processing, the substantially flat surface delimiting a process chamber, the substantially flat surface having a first plurality of gas discharge holes extending therethrough configured to discharge gas onto the first side of the flat substrate;
- a second heated body facing a second side of the flat substrate, wherein the second side is opposite the first side;
- a substrate handling mechanism configured to place the flat substrate to be processed parallel to and in close proximity to the substantially flat surface of the first heated body, and configured to remove the substrate in a removal direction from the first heated body after processing;
- a plurality of heating elements configured to heat the first heated body and a plurality of heating elements associated with the second heated body, the heating elements being arranged to define heating zones and being connected to a controller configured to control the heating elements; and
- a plurality of thermocouples positioned to sense temperatures of the at least one of the first and second heated bodies,
- wherein the controller is programmed to define a first unidirectional temperature gradient laterally across the first heated body and a second unidirectional temperature gradient laterally across the second heated body, wherein the first unidirectional temperature gradient is applied at an angle to the second unidirectional temperature gradient,
- wherein the heating elements are disposed on an opposite side of the flat surface from the process chamber, wherein the first and second heated bodies are configured to absorb heat from the heating elements and to reradiate heat energy to heat the substrate;
- wherein the heating zones associated with the first heated body define a circular area extending beyond a circular area of the substrate and wherein the heating zones associated with the second heated body define a circular area extending beyond the circular area of the substrate, wherein the heating zones associated with the first and second heated bodies each comprise:
- a first heating zone that is a disk-like benter heating zone;
- a second annular heating zone that surrounds the first heating zone; and third and fourth heating zones, wherein the third and fourth heating zones are annular segments extending along a periphery of the associated heated body, the third and fourth heating zones associated with the first heated body are located at opposite sides of a first center line through the first heated body, and the thirds and fourth heating zones associated with the second heated body are located at opposite sides of a second center line through the second heated body, wherein the first center line is at an angle to the second center line and wherein the first center line is at an angle of about $\alpha$ to the removal direction and the second center line is at an angle of about $-\alpha$ to the removal direction.

* * * * *

UNITED STATES PATENT AND TRADEMARK OFFICE
CERTIFICATE OF CORRECTION

PATENT NO. : 7,427,329 B2  Page 1 of 1
APPLICATION NO. : 10/410699
DATED : September 23, 2008
INVENTOR(S) : Vladimir Kuznetsov and Ernst H. A. Granneman It is certified that error appears in the above-identified patent and that said Letters Patent is hereby corrected as shown below:

Title page, item (56), page 2, column 2, line 12, Under Foreign Patent Documents, above "WO/00/68977 11/2000" delete "WO/00/68977 7/2000.".

At column 3, line 31, please change "tipper" to --upper--.

At column 4, line 23-24, please change "300nm" to --300mm--.

At column 13, line 34, please change "a," to --a--.

At column 17, line 7, in Claim 22, after "substrate" insert --.--.

At column 18, line 9, in Claim 26, change "thirds" to --third--.

At column 19, line 6, in Claim 30, change "thirds" to --third--.

Signed and Sealed this

Third Day of March, 2009

JOHN DOLL
*Acting Director of the United States Patent and Trademark Office*